(12) United States Patent
Nishibayashi et al.

(10) Patent No.: US 9,963,801 B2
(45) Date of Patent: May 8, 2018

(54) SINGLE CRYSTAL DIAMOND AND DIAMOND TOOL

(71) Applicants: Sumitomo Electric Industries, Ltd., Osaka-shi (JP); SUMITOMO ELECTRIC HARDMETAL CORP., Itami-shi (JP)

(72) Inventors: Yoshiki Nishibayashi, Itami (JP); Akihiko Ueda, Itami (JP); Hitoshi Sumiya, Itami (JP); Yutaka Kobayashi, Itami (JP); Yuichiro Seki, Itami (JP); Toshiya Takahashi, Itami (JP)

(73) Assignees: Sumitomo Electric Industries, Ltd., Osaka-shi (JP); Sumitomo Electric Hardmetal Corp., Itami-shi (JP)

( * ) Notice: Subject to any disclaimer, the term of this patent is extended or adjusted under 35 U.S.C. 154(b) by 246 days.

(21) Appl. No.: 14/423,884

(22) PCT Filed: Apr. 2, 2014

(86) PCT No.: PCT/JP2014/059713
§ 371 (c)(1),
(2) Date: Feb. 25, 2015

(87) PCT Pub. No.: WO2014/168053
PCT Pub. Date: Oct. 16, 2014

(65) Prior Publication Data
US 2015/0191850 A1 Jul. 9, 2015

(30) Foreign Application Priority Data
Apr. 9, 2013 (JP) ................................. 2013-081157

(51) Int. Cl.
*C30B 29/04* (2006.01)
*C30B 25/00* (2006.01)
*C30B 25/10* (2006.01)

(52) U.S. Cl.
CPC .............. *C30B 29/04* (2013.01); *C30B 25/00* (2013.01); *C30B 25/105* (2013.01)

(58) Field of Classification Search
None
See application file for complete search history.

(56) References Cited

U.S. PATENT DOCUMENTS 4,316,385 A * 2/1982 DeVries ............... G01N 33/381
356/30
2005/0155543 A1 7/2005 Meguro et al.
(Continued)

FOREIGN PATENT DOCUMENTS

| CN | 1441860 A | 9/2003 |
|---|---|---|
| CN | 1681976 A | 10/2005 |

(Continued)

OTHER PUBLICATIONS

Notification of First Office Action in Chinese Patent Appllication No. 201480002248.X, dated May 30, 2016.
(Continued)

*Primary Examiner* — Guinever S Gregorio
(74) *Attorney, Agent, or Firm* — Venable LLP; Michael A. Sartori; Laura G. Remus

(57) ABSTRACT

A single crystal diamond (10) is provided as a single crystal diamond into which a defect portion (11) is introduced. The defect portion (11) can be detected by a phase difference occurring when the single crystal diamond (10) is irradiated with circularly polarized light. In the single crystal diamond (10), a maximum value of average values of the phase differences measured within a measurement region (M)
(Continued)

formed in a shape of a square having a side length of 1 mm is 30 nm or more.

14 Claims, 7 Drawing Sheets

(56) References Cited

U.S. PATENT DOCUMENTS

| | | | |
|---|---|---|---|
| 2006/0231015 A1 | 10/2006 | Meguro et al. | |
| 2008/0311023 A1* | 12/2008 | Yamamoto | C30B 25/105 |
| | | | 423/446 |
| 2008/0311024 A1 | 12/2008 | Meguro et al. | |
| 2010/0111812 A1 | 5/2010 | Meguro et al. | |

FOREIGN PATENT DOCUMENTS

| | | |
|---|---|---|
| CN | 1771356 A | 5/2006 |
| CN | 1865534 A | 11/2006 |
| CN | 101443476 A | 5/2009 |
| EP | 1599621 A1 | 11/2005 |
| EP | 1712661 A1 | 10/2006 |
| EP | 1832672 A1 | 9/2007 |
| JP | 2005-162525 A | 6/2005 |
| JP | 2005-225746 A | 8/2005 |
| JP | 2006-062923 A | 3/2006 |
| JP | 2006-507204 A | 3/2006 |
| JP | 2006-518699 A | 8/2006 |
| JP | 2006-315942 A | 11/2006 |
| JP | 2007-230807 A | 9/2007 |
| JP | 2012-131707 A | 7/2012 |
| WO | WO-01/96633 A1 | 12/2001 |
| WO | WO-2004/027123 A1 | 4/2004 |
| WO | WO-2004/046427 A1 | 6/2004 |
| WO | WO-2004/074557 A1 | 9/2004 |
| WO | WO-2007/066215 A3 | 6/2007 |
| WO | WO-2011/076642 A1 | 6/2011 |

OTHER PUBLICATIONS

International Search Report issued in PCT Application No. PCT/JP2014/059713 dated Jul. 15, 2014.
Extended European Search Report in counterpart European Patent Application No. 14783086.3, dated Nov. 15, 2016.

* cited by examiner

SINGLE CRYSTAL DIAMOND AND DIAMOND TOOL

TECHNICAL FIELD

The present invention relates to a single crystal diamond and a diamond tool, and more particularly to a single crystal diamond having a defect portion introduced thereinto and a diamond tool including the single crystal diamond.

BACKGROUND ART

Conventionally, diamond tools such as a cutting tool and a wear-resistant tool have been made using a natural diamond or a diamond produced by the high pressure high temperature (HPHT) method. A natural diamond however exhibits large variations in quality, and cannot be supplied in a constant amount. A diamond produced by the high pressure high temperature method exhibits less variations in quality and can be supplied in a constant amount, but poses a problem that the cost for manufacturing facilities is high.

Another method of synthesizing a diamond is a vapor phase synthesis method such as a chemical vapor deposition (CVD) method. For example, Japanese Patent Laying-Open No. 2005-162525 (hereinafter abbreviated as PTD 1) discloses a diamond produced by the vapor phase synthesis method, which is transparent in an ultraviolet region and exhibits less crystal defects and strains. Furthermore, for example, Japanese Patent Laying-Open No. 2006-315942 (hereinafter abbreviated as PTD 2) discloses a diamond single crystal used in a semiconductor device substrate and exhibiting less strains. Furthermore, for example, Japanese Patent National Publication No. 2006-507204 (hereinafter abbreviated as PTD 3) discloses a CVD single crystal diamond material that is suitable to be used in an optical device or element. However, the diamond produced by such a vapor phase synthesis method poses a problem that chipping tends to readily occur when it is used for a tool material.

CITATION LIST

Patent Document

PTD 1: Japanese Patent Laying-Open No. 2005-162525
PTD 2: Japanese Patent Laying-Open No. 2006-315942
PTD 3: Japanese Patent National Publication No. 2006-507204

SUMMARY OF INVENTION

Technical Problem

A single crystal diamond has a characteristic that cleavage readily occurs in a (111) plane. Accordingly, in a single crystal diamond including less impurities and defects, a crack occurs along a part of a cleavage plane (a (111) plane) by a mechanical impact and spreads through the crystal, thereby causing macroscopic chipping. In contrast to this, the inventors of the present invention have found that, when impurities such as nitrogen and boron exist in a crystal, these impurities act to prevent development of cracks, so that occurrence of large-scale chipping is suppressed. The inventors of the present invention have also found that defects such as atomic vacancies and dislocations in a crystal also have an effect of preventing development of cracks as in the case of impurities. However, if relatively small amounts of impurities and defects exist, an effect of preventing macroscopic chipping cannot be achieved. Accordingly, appropriate amounts of impurities and defects need to exist. Thus, the inventors of the present invention have predicted that impurities and defects are introduced into a diamond crystal in a controlled manner, thereby achieving a diamond that is improved in mechanical strength and not readily chipped.

As described above, it was qualitatively predicted that occurrence of chipping is suppressed by introducing impurities and defects into a diamond crystal in a controlled manner, but quantitative knowledge about this has not been obtained. This is because it is difficult by the high pressure high temperature method to introduce impurities and defects into a crystal in a controlled manner and also because impurities and defects are already introduced into a natural diamond. Furthermore, according to the vapor phase synthesis method, it is relatively easy to introduce impurities in a controlled manner, but difficult to introduce defects in a controlled manner. Accordingly, in the case where a crystal is grown by the CVD method, conventionally, defects, strains and the like remain irregularly and locally within the crystal without being controlled. Therefore, chipping tends to readily occur in the diamond produced in this case.

The present invention has been made in light of the above-described problems. An object of the present invention is to provide: a single crystal diamond in which occurrence of chipping is suppressed by introducing a defect thereinto in a controlled manner; and a diamond tool that is improved in durability by including the single crystal diamond.

Solution to Problem

A single crystal diamond according to the present invention is provided as a single crystal diamond into which a defect portion is introduced. The defect portion is capable of being detected by a phase difference occurring when the single crystal diamond is irradiated with circularly polarized light. In the single crystal diamond, a maximum value of average values of the phase differences measured within a measurement region formed in a shape of a square having a side length of 1 mm is 30 nm or more.

The inventors of the present invention have carried out concentrated studies about introduction of a defect portion into a single crystal diamond in a controlled manner. As a result, the inventors of the present invention have found that, when a defect portion is introduced into a crystal in a controlled manner such that the maximum value of average values of the above-described phase differences falls within the above-described range, occurrence of chipping in a diamond is significantly suppressed, and thereby conceived of the present invention. In the single crystal diamond according to the present invention, a defect portion is introduced into a crystal in a controlled manner such that the maximum value of average values of the phase differences is 30 nm or more. Therefore, according to the single crystal diamond of the present invention, it becomes possible to provide a single crystal diamond in which occurrence of chipping is suppressed.

In addition, in the single crystal diamond described above, the maximum value of the average values of the phase differences is 30 nm or more when the phase differences are measured in a plurality of the measurement regions.

In the single crystal diamond, a standard deviation of the phase differences measured within the measurement region may be 30 nm or more.

Accordingly, defect portions can be introduced into a single crystal diamond so as to be more uniformly dispersed.

As a result, it becomes possible to provide a single crystal diamond in which occurrence of chipping is more effectively suppressed.

In the single crystal diamond, a plurality of peaks may exist in a frequency distribution of the phase differences measured within the measurement region. Furthermore, a first peak existing in a region of values smaller than the average value of the phase differences and a second peak existing in a region of values larger than the average value of the phase differences may exist in the frequency distribution of the phase differences measured within the measurement region.

Accordingly, defect portions can be introduced into a single crystal diamond so as to be more uniformly dispersed. Consequently, it becomes possible to provide a single crystal diamond in which occurrence of chipping is further more effectively suppressed.

In the single crystal diamond, the defect portions may be introduced so as to be arranged in a straight line. Furthermore, the defect portions may be introduced so as to be arranged in an arc line.

In this way, in the single crystal diamond, the defect portions may be introduced so as to be arranged in an arbitrary shape.

The single crystal diamond may be formed by a vapor phase synthesis method. Accordingly, a defect portion can be readily introduced into a single crystal diamond in a controlled manner.

The single crystal diamond may be used for a diamond tool. The single crystal diamond in which occurrence of chipping is suppressed is suitable as a diamond used for the diamond tool.

The diamond tool according to the present invention includes the single crystal diamond in which occurrence of chipping is suppressed. Therefore, according to the diamond tool of the present invention, the diamond tool excellent in durability can be provided.

Advantageous Effects of Invention

As apparent from the above description, according to the single crystal diamond of the present invention, a single crystal diamond in which occurrence of chipping is suppressed can be provided. Furthermore, according to the diamond tool of the present invention, a diamond tool excellent in durability can be provided.

DESCRIPTION OF EMBODIMENTS

Figure 1:
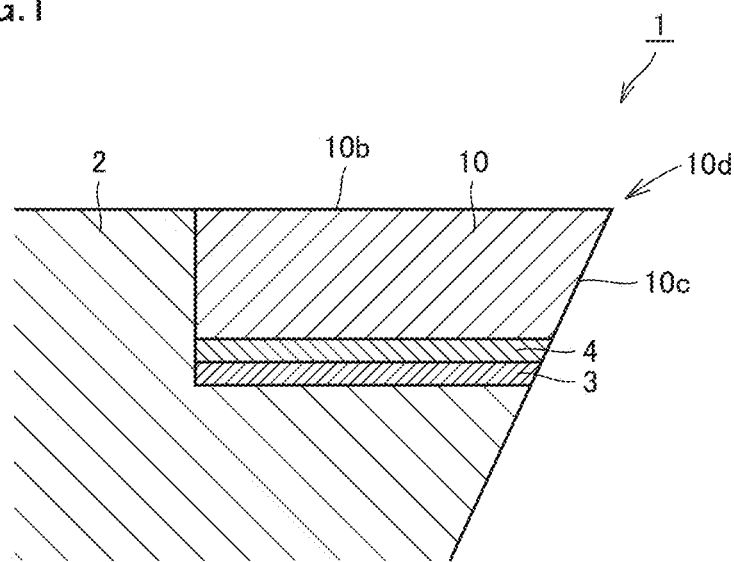
FIG. 1 is a schematic diagram showing a diamond bit according to the present embodiment.

The embodiments of the present invention will be hereinafter described with reference to the accompanying drawings, in which the same or corresponding components are designated by the same reference characters, and description thereof will not be repeated.

First, a diamond bit 1 will be hereinafter described as an example of a diamond tool according to one embodiment of the present invention. Referring to FIG. 1, diamond bit 1 according to the present embodiment mainly includes a base metal 2, a brazing layer 3, a metallized layer 4, and a single crystal diamond 10.

Single crystal diamond 10 is fixed to base metal 2 through brazing layer 3 and metallized layer 4. Single crystal diamond 10 includes a rake face 10b and a flank face 10c. A cutting edge 10d is formed at a portion where rake face 10b and flank face 10c are in contact with each other. Single crystal diamond 10 is provided as a single crystal diamond according to the present embodiment in which occurrence of chipping is suppressed as described later. Accordingly, diamond bit 1 results in a diamond tool that is further improved in durability.

Furthermore, the diamond tool according to the present invention is not limited to diamond bit 1 described above, but for example may be other cutting tools (not shown) such as a drill or an end mill, or may be wear-resistant tools (not shown) such as a dresser, a stylus, a nozzle, or a dice. These cutting tools and wear-resistant tools each are provided with single crystal diamond 10, and therefore, can be improved in durability like diamond bit 1.

Figure 2:
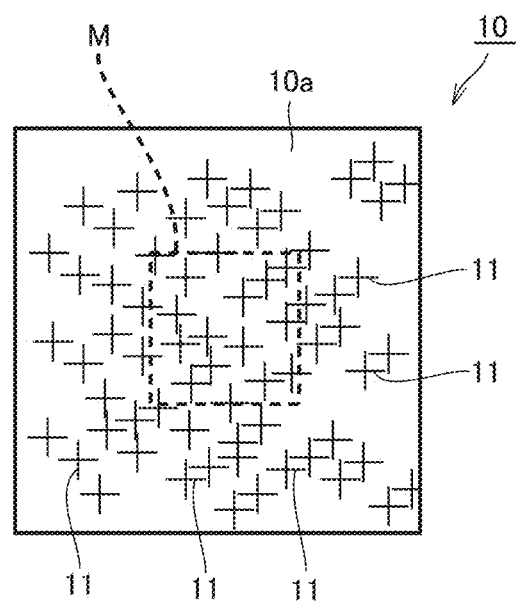
FIG. 2 is a schematic diagram showing a single crystal diamond according to the present embodiment.

Then, single crystal diamond 10 according to the present embodiment will be hereinafter described. As described above, single crystal diamond 10 according to the present embodiment is used as a material for a diamond tool such as diamond bit 1. FIG. 2 is a schematic plan view as seen from the main surface 10a side of single crystal diamond 10. Referring to FIG. 2, single crystal diamond 10 is produced, for example, by the vapor phase synthesis method such as a CVD (Chemical Vapor Deposition) method, and has a flat plate shape (a square shape, a rectangular shape, or a octagonal shape), for example. In single crystal diamond 10, defect portions 11 such as strains, atomic vacancies or dislocations are randomly dispersed within main surface 10a. Each defect portion 11, which is schematically shown in FIG. 2 by two straight lines orthogonal to each other, can be detected, for example, by birefringence distribution measurement which will be described later.

Then, an example of a method for detecting defect portion 11 introduced into single crystal diamond 10 will be hereinafter described. First, single crystal diamond 10 is processed into a plate shape having a thickness of 700 μm. When single crystal diamond 10 is relatively thick, it may be processed, for example, by polishing, etching or the like. In addition, when single crystal diamond 10 is a thin plate that cannot be processed to have a thickness of 700 μm, measurement that will be described later may be performed without performing the above-described processing. Then, the obtained measurement value may be converted in terms of a thickness of 700 μm in proportion to the plate thickness.

Then, one of main surfaces of single crystal diamond 10 is irradiated with circularly polarized light almost vertically to this one of the main surfaces. Since a diamond is an isotropic crystal, it usually has an isotropic refractive index (permittivity). In a portion into which defect portion 11 is introduced, however, this diamond has a birefringence index that exhibits different refractive indexes depending on directions. Accordingly, when defect portion 11 is irradiated with circularly polarized light, a phase difference occurs to produce elliptically polarized light (including linearly polarized light), which is then emitted. On the other hand, when a portion excluding defect portion 11 is irradiated with circularly polarized light, a phase difference does not occur, and circularly polarized light is emitted without being changed. Furthermore, the optical axis and the phase difference can be obtained by obtaining directions of the major axis and the minor axis of an ellipse in the elliptically polarized light, and the length ratio of the major axis to the minor axis. Furthermore, the information about the local phase difference in a microscopic portion can be obtained by combining a lens or a microscope. Furthermore, by arranging an integrated polarizer in front of pixels of a digital detector, the information in each pixel (that is, information about the local position of a sample) can be obtained in two dimensions. The values of the phase differences (nm) caused by existence of defect portion 11 is measured using the principle as described above, thereby allowing detection of defect portion 11 introduced into single crystal diamond 10.

Furthermore, the above-described measurement can be carried out, for example, using a birefringence distribution measurement apparatus (WPA-micro or WPA-100 manufactured by Photonic Lattice, Inc.). In general, a phase difference is difficult to be distinguished when it exceeds 90 degrees (¼ of a wavelength). The above-mentioned birefringence distribution measurement apparatus, however, uses an integrated wavelength plate scheme instead of an integrated polarizer scheme. Accordingly, the measurement range is extended to a phase difference of 180 degrees (½ of a wavelength). In addition, it was experimentally verified that the measurement range is extended to 5 to 6 times the wavelength when three types of wavelengths (one center wavelength and two wavelengths located in proximity thereto) are used.

According to single crystal diamond 10, when the above-described phase differences are measured within a measurement region M (1 mm×1 mm), the maximum value of average values of the phase differences is 30 nm or more, preferably 50 nm or more, and more preferably 100 nm or more. Furthermore, the standard deviation of the above-described phase differences measured within measurement region M is 30 nm or more, preferably 100 nm or more, and more preferably 200 nm or more. Furthermore, the maximum value of the above-described phase differences measured within measurement region M is 100 nm or more. In this way, in single crystal diamond 10, defect portions 11 are introduced in a controlled manner (so as to be dispersed within main surface 10a in high densities and at random) such that the maximum value of average values of the above-described phase differences, the standard deviation of the above-described phase differences and the maximum value of the above-described phase differences fall within the above-mentioned ranges, respectively. Accordingly, single crystal diamond 10 results in a diamond in which occurrence of chipping is suppressed.

Figure 3:
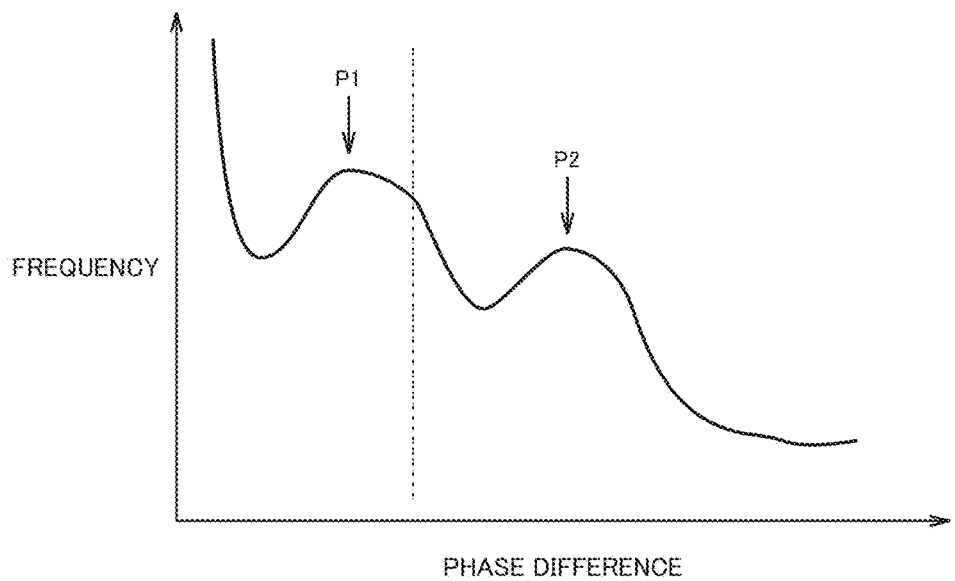
FIG. 3 is a graph showing a frequency distribution of phase differences in the single crystal diamond according to the present embodiment.

FIG. 3 is a graph showing a frequency distribution of the above-described phase differences measured within measurement region M (see FIG. 2) in single crystal diamond 10. In the graph in FIG. 3, the horizontal axis and the vertical axis show a phase difference and a frequency, respectively, and the dashed line along the vertical axis shows the average value of the phase differences. This frequency distribution includes: a first peak P1 that exists in a region of values smaller than the average value of the above-described phase differences; and a second peak P2 that exists in a region of values larger than the average value of the above-described phase differences and is smaller in frequency than first peak P1. Furthermore, second peak P2 exists in a region of values equal to or greater than 5% of the maximum value of the above-described phase differences, preferably in a region of values equal to or greater than 10% of the maximum value of the above-described phase differences, and more preferably in a region of values equal to or greater than 20% of the maximum value of the above-described phase differences. In addition, this frequency distribution is not limited to the case where two peaks exist, but three peaks or three or more peaks may exist, for example.

Figure 4:
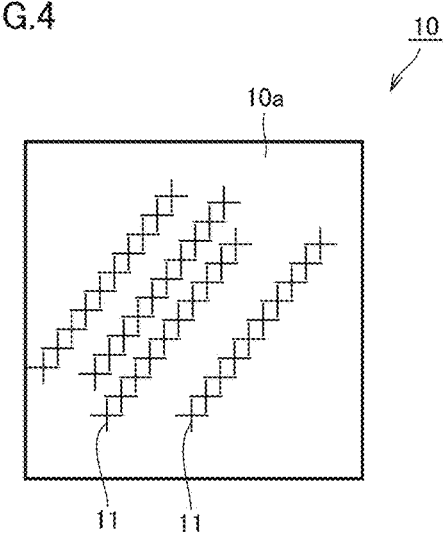
FIG. 4 is a schematic diagram showing the state where defect portions are arranged in a straight line in the single crystal diamond according to the present embodiment.
Figure 5:
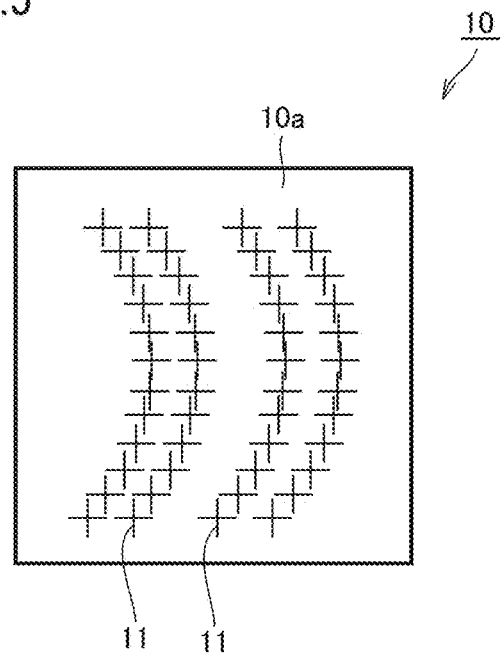
FIG. 5 is a schematic diagram showing the state where defect portions are arranged in an arc line in the single crystal diamond according to the present embodiment.

Furthermore, single crystal diamond 10 is not limited to the case where defect portions 11 are introduced so as to be dispersed at random, but defect portions 11 may be introduced so as to be arranged in a straight line as shown in FIG. 4, or may be introduced so as to be arranged in an arc line as shown in FIG. 5. Furthermore, straight lines each formed by defect portions 11 arranged in a straight line or arc lines each formed by defect portions 11 arranged in an arc line may be provided at intervals so as to extend side by side. It is to be noted that the number of these straight lines or arc lines is not particularly limited, but may be four as shown in FIGS. 4 and 5, or may be four or more.

As described above, in single crystal diamond 10 according to the present embodiment, defect portions 11 are introduced into a crystal in a controlled manner such that the maximum value of average values of the phase differences described above is 30 nm or more. Therefore, this single crystal diamond 10 results in a diamond in which occurrence of chipping is suppressed.

Furthermore, in the above-described single crystal diamond 10, the standard deviation of the phase differences measured within measurement region M may be 30 nm or more, as described above.

Accordingly, defect portions 11 are more uniformly dispersed in single crystal diamond 10 as shown in FIG. 2. Consequently, occurrence of chipping can be more effectively suppressed in single crystal diamond 10.

Furthermore, in the above-described single crystal diamond 10, a plurality of peaks may exist in the frequency distribution of the phase differences measured within measurement region M, as described above. Furthermore, first peak P1 may exist in a region of values smaller than the average value of the above-described phase differences while second peak P2 may exist in a region of values larger than the average value of the above-described phase differences.

Accordingly, defect portions 11 are further more uniformly dispersed in single crystal diamond 10. Consequently, occurrence of chipping can be more effectively suppressed in single crystal diamond 10.

Figure 6:
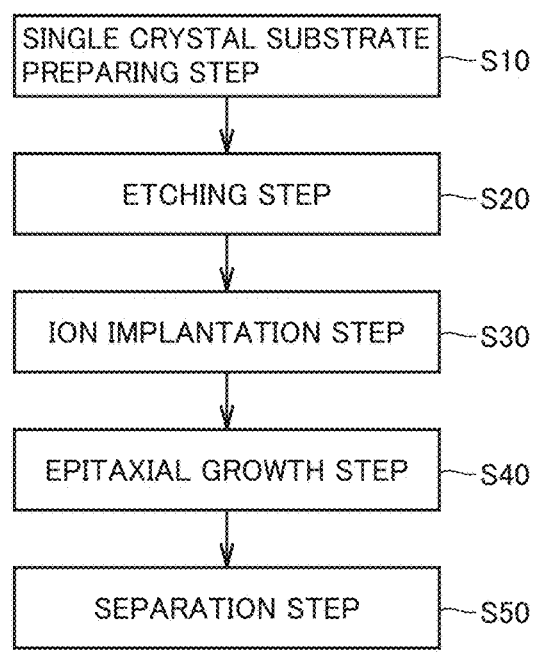
FIG. 6 is a flowchart schematically illustrating a method of manufacturing a single crystal diamond according to the present embodiment.

Then, the method of manufacturing a single crystal diamond according to the present embodiment will be hereinafter described. Referring to FIG. 6, in the method of manufacturing a single crystal diamond according to the present embodiment, the steps (S10) to (S50) are sequentially performed, so that single crystal diamond 10 according to the present embodiment can be produced.

Figure 7:
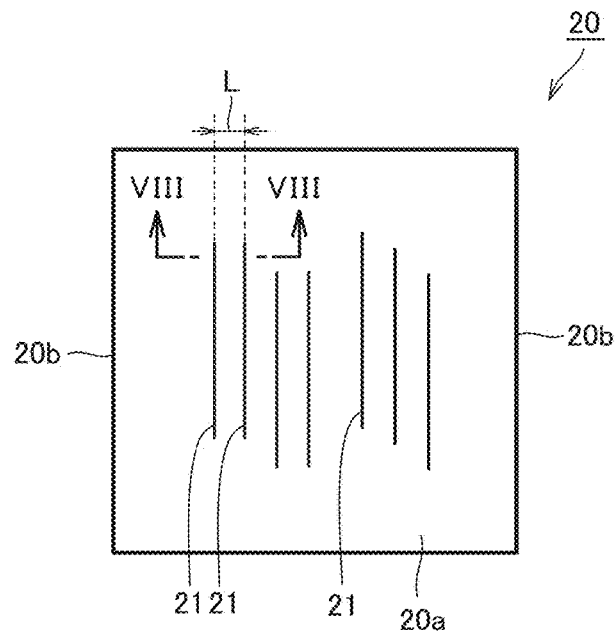
FIG. 7 is a schematic side view for illustrating the step (S10) in the method of manufacturing a single crystal diamond according to the present embodiment.

First, a single crystal substrate preparing step is carried out as step (S10). In this step (S10), referring to FIG. 7, a single crystal substrate 20 (type: Ib) having a flat plate shape (a square shape) and made of a diamond produced by the high pressure high temperature method is prepared. Single crystal substrate 20 has a surface 20a including a (100) plane and a side surface 20b including a (001) plane perpendicular to surface 20a. It is to be noted that the shape of single crystal substrate 20 is not limited to a square shape as shown in FIG. 7, but may be a rectangular shape or an octagonal shape, for example.

A plurality of grooves 21 are provided so as to extend side by side on surface 20a of single crystal substrate 20. A distance L between grooves 21 adjacent to each other is more than 10 μm and not more than 100 μm, preferably more than 10 μm and less than 20 μm, or not less than 20 μm and not more than 100 μm.

Furthermore, groove 21 may be provided, for example, by forming a resist pattern in a line shape on surface 20a using the photolithography method, and then, using plasma to etch surface 20a of single crystal substrate 20 in a portion having no resist pattern formed thereon. Furthermore, groove 21 may be provided by processing surface 20a of single crystal substrate 20 into a line shape using a laser processing machine (grooving process). Furthermore, groove 21 may be provided by mechanically shaving surface 20a of single crystal substrate 20 (mechanical polishing). Furthermore, in this mechanical polishing, a grinding machine having diamond abrasive grains embedded therein; a grinding machine fabricated using cast iron; or a grinding machine fabricated using silicon dioxide ($SiO_2$) can be used, for example.

In the case of the above-described mechanical polishing, grooves 21 each in a line shape can be provided, and a plurality of grooves 21 each formed in a line shape can be arranged in a grid pattern. On the other hand, in the case of plasma processing or laser processing using the above-described photolithography method, each groove formed in an arc shape or in other shapes can be provided. Also, cutting can be carried out by means of laser in the slicing direction. Consequently, height differences can be provided at intervals on surface 20a of single crystal substrate 20. In this way, grooves 21 can be formed in surface 20a of single crystal substrate 20 so as to be appropriately distributed.

Furthermore, grooves 21 only have to be formed so as to be appropriately distributed in surface 20a, and may be randomly formed. In this case, more simple methods such as a method using the above-described mechanical polishing and a method of performing heat treatment in an oxygen atmosphere can be employed, for example.

Figure 8:
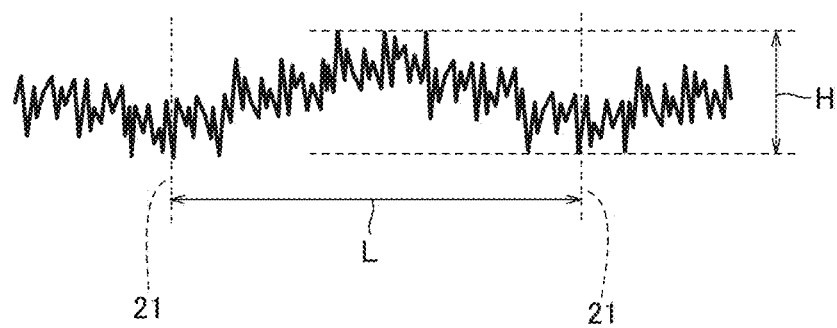
FIG. 8 is a diagram showing a height profile on a surface of a single crystal substrate along a line segment VIII-VIII in FIG. 7.

FIG. 8 shows a height profile on surface 20a of single crystal substrate 20 along a line segment VIII-VIII in FIG. 7. In FIG. 8, the horizontal direction shows the distance in the direction along surface 20a of single crystal substrate 20 while the vertical direction shows a height. On surface 20a of single crystal substrate 20, a height difference H corresponding to a difference between the minimum height (a portion in which groove 21 is formed) and the maximum height is 15 nm or more, preferably 50 nm or more, and more preferably 300 nm or more. In this way, surface 20a of single crystal substrate 20 is processed such that distance L between grooves 21 and height difference H fall within the above-described ranges, respectively. Accordingly, in the step (S40) described later, an epitaxial growth layer having defect portions introduced thereinto in a controlled manner can be grown on single crystal substrate 20.

Then, an etching step is carried out as step (S20). In this step (S20), referring to FIG. 7, surface 20a is etched by reactive ion etching (RIE), for example, using oxygen ($O_2$) gas and carbon tetrafluoride ($CF_4$) gas. The etching method is not limited to RIE, but may be sputtering, for example, using argon (Ar) gas as main gas.

Furthermore, this step (S20) is an extremely important step in the case where surface 20a is processed using a grinding machine having diamond abrasive grains embedded therein. In other words, in the case of mechanical polishing using the above-described grinding machine, a relatively large height difference is provided on surface 20a, so that polishing damage on surface 20a is increased. Consequently, abnormal particles are grown on surface 20a, thereby forming a polycrystal. On the other hand, when polishing damage on surface 20a is removed by ion etching, formation of a polycrystal caused by growth of abnormal particles can be suppressed. In addition, polishing damage on surface 20a is reduced when performing: mechanical polishing by a grinding machine fabricated using $SiO_2$; surface cutting by means of laser; or heat treatment in an oxygen atmosphere. Accordingly, the above-described step (S20) can also be omitted.

Then, an ion implantation step is carried out as step (S30). In this step (S30), referring to FIG. 9, carbon (C) or phosphorus (P) is implanted into single crystal substrate 20 from the surface 20a side. Consequently, a conductive layer 22 is formed in a region including surface 20a.

Figure 10:
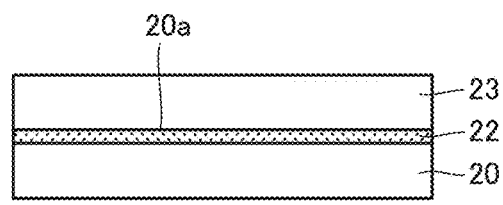
FIG. 10 is a schematic diagram for illustrating the step (S40) in the method of manufacturing a single crystal diamond according to the present embodiment.

Then, an epitaxial growth step is carried out as step (S40). In this step (S40), referring to FIG. 10, an epitaxial growth layer 23 made of a single crystal diamond is grown on conductive layer 22, for example, by the microwave plasma (MP) CVD method. The method of forming epitaxial growth layer 23 is not limited to the MP-CVD method, but may be the hot-filament (HF) CVD method or the DC plasma method, for example.

It is preferable that epitaxial growth layer 23 grows on the conditions that a growth parameter ($\alpha$) in a region of 1 μm to 7 μm at least in an early stage of growth (a region extending 1 μm or more and 7 μm or less from surface 20a in the growth direction) is 2 or more, and the temperature of single crystal substrate 20 is 1050° C. or lower. The growth parameter ($\alpha$) is a value equal to the square root of 3 of the ratio of the growth rate in the <100> direction to the growth rate in the <111> direction. Accordingly, even when the height difference on surface 20a of single crystal substrate 20 is relatively large, a single crystal diamond (epitaxial growth layer 23) can be grown with stability.

Figure 11:
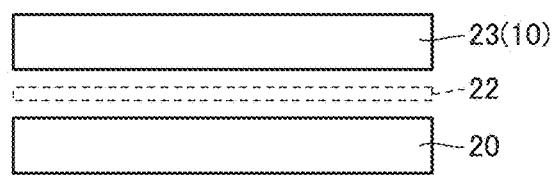
FIG. 11 is a schematic diagram for illustrating the step (S50) in the method of manufacturing a single crystal diamond according to the present embodiment.

Then, a separation step is carried out as step (S50). In this step (S50), referring to FIG. 11, conductive layer 22 is electrochemically etched, so that single crystal substrate 20 and epitaxial growth layer 23 are separated. In this way, single crystal diamond 10 (epitaxial growth layer 23) is obtained. By performing the steps (S10) to (S50) as described above, single crystal diamond 10 is produced, and thus, the method of manufacturing a single crystal diamond according to the present embodiment is completed.

Examples (Production of Single Crystal Diamond)

Experiments were carried out for confirming the effect of the present invention of suppressing occurrence of chipping in a single crystal diamond. First, single crystal diamond 10 was produced by using the method of manufacturing a single crystal diamond according to the present embodiment described above (see FIGS. 6 to 11). In step (S10), single crystal substrate 20 having a square shape of 5 mm×5 mm and a thickness of 0.7 mm was prepared (see FIG. 7). Furthermore, height difference H on surface 20a of single crystal substrate 20 was 15 nm or more, and distance L between grooves 21 was more than 10 μm and not more than 100 μm (see FIG. 8). In step (S20), single crystal substrate 20 was etched by ME from surface 20a to a depth region of 0.3 μm, or etched by sputtering from surface 20a to a depth region of 0.1 μm (see FIG. 7).

Figure 9:
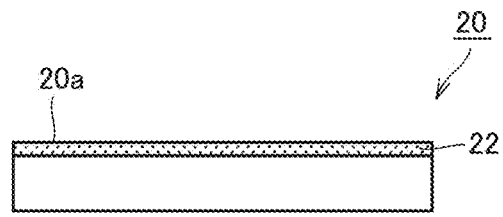
FIG. 9 is a schematic diagram for illustrating the step (S30) in the method of manufacturing a single crystal diamond according to the present embodiment.

In step (S30), carbon ions were implanted with ion implantation energy of 300 keV to 350 keV and at a dose amount of $5×10^{15}$ to $5×10^{17}$ pieces/cm$^2$, thereby forming conductive layer 22 (see FIG. 9). In step (S40), epitaxial growth layer 23 having a thickness of 0.7 mm was formed (see FIG. 10). Using hydrogen ($H_2$) gas, methane ($CH_4$) gas and nitrogen ($N_2$) gas, the concentration of $CH_4$ gas to $H_2$ gas was set at 5% to 20%, and the concentration of $N_2$ gas to $CH_4$ gas was set at 0.5% to 4%. The pressure was also set at 9.3 kPa to 14.7 kPa, and the substrate temperature was set at 800° C. to 1100° C. The size of single crystal diamond 10 was 1 mm×1 mm, 3 mm×3 mm, or 6 mm×6 mm. In this way, single crystal diamonds 10 in Examples 1 to 6 were produced. Also, as Comparative Examples 1 to 3, single crystal diamonds were produced such that height difference H and distance L between grooves 21 on surface 20a of single crystal substrate 20 were beyond the above-described ranges, respectively.

(Measurement of Phase Difference)

The growth surfaces of the single crystal diamonds in Examples 1 to 6 and Comparative Examples 1 to 3 were polished, and then, the phase differences were measured. Each phase difference was measured using a birefringence distribution measurement apparatus (WPA-100 manufactured by Photonic Lattice, Inc.) and defining a plurality of measurement regions M (1 mm×1 mm) within main surface 10a of single crystal diamond 10 as described above (see FIG. 2). Furthermore, the above-described measurement apparatus was adjusted using a lens such that information in an area of 20 μm×20 μm could be obtained from a sample (a single crystal diamond). It is to be noted that the above-described measurement apparatus allows measurement in a range of phase differences of 0 nm to 3000 nm using three types of wavelengths (523 nm, 543 nm, and 575 nm).

(Examinations about Occurrence of Chipping after Cutting Work, Surface Roughness of Workpiece, and Occurrence of Burrs)

Single crystal diamonds in Examples 1 to 6 and Comparative Examples 1 to 3 described above, a polycrystal diamond (D1000), and a high-pressure synthetic diamond each were used as a cutter blade to perform cutting work for a work material (workpiece). Then, it was examined whether chipping occurred or not in each case. As a cutter, RF4080R manufactured by Sumitomo Electric Hardmetal Corporation was used. As a wiper chip, SNEW1204 ADFR-WS manufactured by Sumitomo Electric Hardmetal Corporation was used. As a lathe, NV5000 manufactured by DMG Mori Seiki Co., Ltd. was used. The cutting speed was set at 2000 m/min. Cutting was made by 0.05 mm. The feed rate was set at 0.05 mm/blade, 0.1 mm/blade, or 0.15 mm/blade. As a workpiece, an aluminum material (A5052) was used. After the workpiece was subjected to cutting work on the above-described conditions, it was examined whether chipping occurred or not in each diamond. Furthermore, the surface roughness (μm) of the workpiece and occurrence of burrs were also examined on each of the feed rate conditions (mm/blade).

(Examination about Occurrence of Chipping During Cutting Edge Polishing Processing)

Single crystal diamonds in Examples 1 to 6 and Comparative Examples 1 to 3 each were subjected to polishing processing for exposing a cutting edge for a bit tool. Then, the number of chips (chipping) was examined that was obtained by observations along a length of 2 mm after processing. In addition, chipping of 5 μm or more was defined as an examination target.

Figure 12:
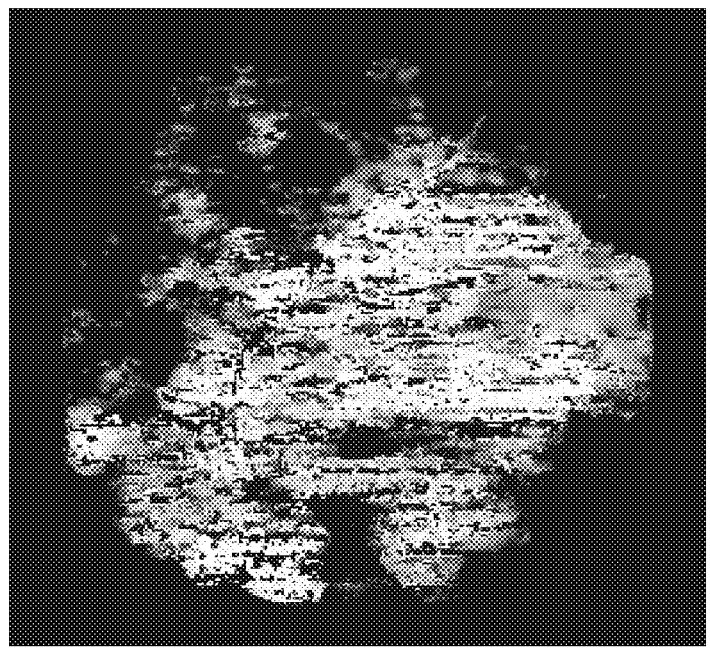
FIG. 12 is a photograph of a phase difference distribution of a single crystal diamond in an Example.
Figure 13:
FIG. 13 is a photograph of a phase difference distribution of a single crystal diamond in a Comparative Example.
Figure 14:
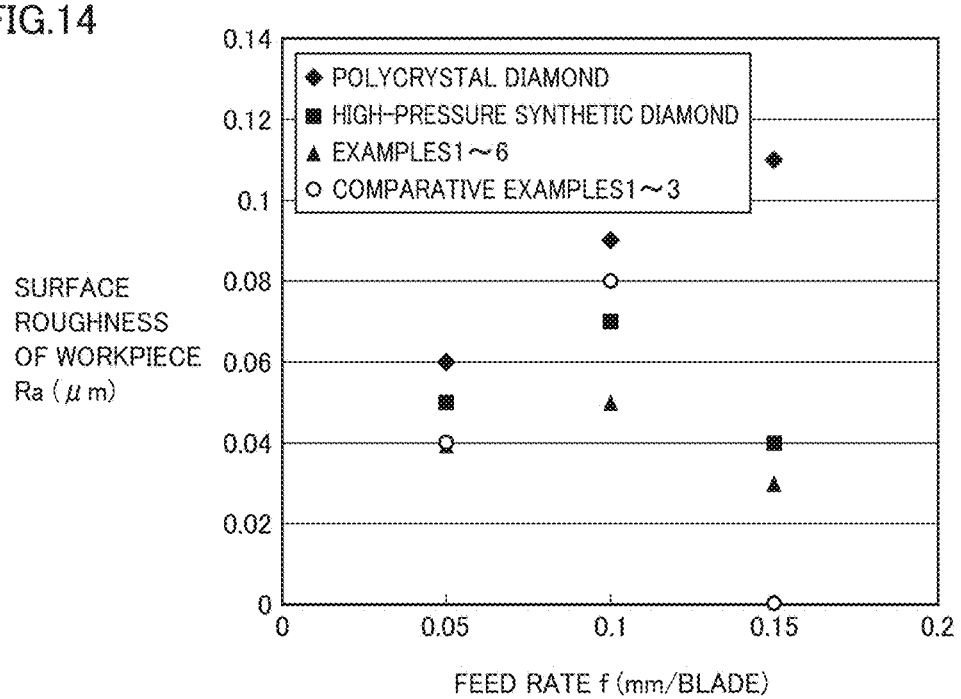
FIG. 14 is a graph showing the relation between a feed rate and a surface roughness of a workpiece.

The above-described experimental results are shown in Tables 1 and 2 and FIGS. 12 to 14. Table 1 shows the results about phase difference measurement; the examination results about occurrence of chipping during cutting edge polishing processing; and the examination results about occurrence of chipping after cutting work. Furthermore, Table 2 shows the examination results about occurrence of burrs after cutting work. Furthermore, FIGS. 12 and 13 each show a photograph of birefringence in a single crystal diamond in each of Examples 1 to 6 and Comparative Examples 1 to 3. Furthermore, FIG. 14 is a graph showing the relation between the feed rate (mm/blade) and the surface roughness (μm) of the workpiece, in which the horizontal axis shows the feed rate (mm/blade) while the vertical axis shows the surface roughness (μm) of the workpiece.

TABLE 1

| | Height Difference H (nm) | Distance L (μm) | Size (mm × mm) | Average Value (Maximum) of Phase Differences (nm) | Standard Deviation (nm) | Position of First Peak (nm) | Position of Second Peak (nm) | Chipping during Cutting Edge Polishing Processing (piece/2 mm) | Occurrence of Chipping after Cutting Work |
|---|---|---|---|---|---|---|---|---|---|
| Example 1 | 15 | 20 | 3 × 3 | 68 | 100 | 30 | 130 | 0 | Not Occurred |
| Example 2 | 20 | 40 | 3 × 3 | 30 | 35 | 17 | 50 | 0 | Not Occurred |
| Example 3 | 30 | 50 | 1 × 1 | 70 | 30 | 20 | 75 | 0 | Not Occurred |
| Example 4 | 50 | 50 | 6 × 6 | 80 | 90 | 30 | 90 | 0 | Not Occurred |
| Example 5 | 300 | 100 | 3 × 3 | 160 | 155 | 120 | 350 | 0 | Not Occurred |
| Example 6 | 500 | 100 | 3 × 3 | 170 | 220 | 100 | 400 | 0 | Not Occurred |
| Comparative Example 1 | 8 | 15 | 3 × 3 | 3.5 | 3.7 | 2 | Nil | 4 | Occurred |

TABLE 1-continued

| | Height Difference H (nm) | Distance L (μm) | Size (mm × mm) | Average Value (Maximum) of Phase Differences (nm) | Standard Deviation (nm) | Position of First Peak (nm) | Position of Second Peak (nm) | Chipping during Cutting Edge Polishing Processing (piece/2 mm) | Occurrence of Chipping after Cutting Work |
|---|---|---|---|---|---|---|---|---|---|
| Comparative Example 2 | 4 | 10 | 3 × 3 | 3 | 3.7 | 3 | Nil | 5 | Occurred |
| Comparative Example 3 | 50 | 300 | 3 × 3 | 21 | 28 | 14 | Nil | 3 | Occurred |

TABLE 2

| | Feed Rate (mm/blade) | | |
|---|---|---|---|
| | 0.05 | 0.1 | 0.15 |
| Polycrystal Diamond | Burr (large) | Burr (medium) | Burr (small) |
| High-Pressure Synthetic Diamond | Not Occurred | Not Occurred | Not Occurred |
| Examples 1 to 6 | Not Occurred | Not Occurred | Not Occurred |
| Comparative Examples 1 to 3 | Not Occurred | Not Occurred | Not Occurred |

(Measurement of Phase Difference)

The measurement results about phase differences will be hereinafter explained. In the photograph of the phase difference distribution in each of FIGS. 12 and 13, a region exhibiting a relatively large phase difference (a region into which defect portions were introduced) was represented in white while a region exhibiting a relatively small phase difference was represented in black. As apparent from FIGS. 12 and 13, the region represented in white in the photograph of the phase difference distribution was widely formed within a plane in Examples 1 to 6 (FIG. 12), whereas the region represented in white was hardly formed in Comparative Examples 1 to 3 (FIG. 13). Furthermore, as apparent from Table 1, the maximum value of average values of the phase differences was 30 nm or more in each of Examples 1 to 6, whereas the maximum value of average values of the phase differences was less than 30 nm in each of Comparative Examples 1 to 3. Furthermore, the phase differences were measured using a wavelength of 543 nm, and each maximum value of the phase differences was 2000 nm or less. It was found from these results that height difference H on the surface of a single crystal substrate is set at 15 nm or more, and distance L between grooves 21 is set at more than 10 μm and 100 μm or less, which leads to 30 nm or more of the maximum value of average values of the phase differences in the single crystal diamond formed on the single crystal substrate.

(Examination about Occurrence of Chipping after Cutting Work)

The examination results about occurrence of chipping after cutting work will be hereinafter explained. Referring to Table 1, when the feed rate was set at 0.15 mm/blade, occurrence of chipping was not observed after cutting work in Examples 1 to 6, whereas occurrence of chipping was observed in Comparative Examples 1 to 3. It was found from these results that occurrence of chipping is suppressed by setting the maximum value of average values of the phase differences in a single crystal diamond at 30 nm or more.

(Examination about Surface Roughness of Workpiece after Cutting Work)

The examination results about the surface roughness of the workpiece after cutting work will be hereinafter explained. Referring to FIG. 14, the surface roughness of the workpiece was increased with an increase in the feed rate (mm/blade) in the case of the polycrystal diamond, whereas the surface roughness of the workpiece was greatly decreased at the feed rate of 0.15 mm/blade in the case of the single crystal diamond in each of Examples 1 to 6. Furthermore, in the case of the single crystal diamond in each of Comparative Examples 1 to 3, chipping occurred at the feed rate of 0.15 mm/blade, as described above.

(Examination about Occurrence of Burrs after Cutting Work)

The examination results about occurrence of burrs after cutting work will be hereinafter described. Referring to Table 2, occurrence of burrs was observed in the workpiece after cutting work in the case of a polycrystal diamond, whereas occurrence of burrs was not observed in the case of a high-pressure synthetic diamond and a single crystal diamond in each of Examples 1 to 6 and Comparative Examples 1 to 3.

(Examination about Occurrence of Chipping During Cutting Edge Polishing Processing)

The examination results about occurrence of chips (chipping) during cutting edge polishing processing will be hereinafter described. Referring to Table 1, the number of occurred chippings was zero in each of Examples 1 to 6, whereas three or more chippings were observed in each of Comparative Examples 1 to 3. It was found from these results that occurrence of chipping was suppressed by setting the maximum value of average values of the phase differences in a single crystal diamond at 30 nm or more.

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

INDUSTRIAL APPLICABILITY

The single crystal diamond and the diamond tool according to the present invention can be particularly advantageously applied to a single crystal diamond for which occurrence of chipping needs to be suppressed and a diamond tool that needs to be improved in durability.

REFERENCE SIGNS LIST

1 diamond bit, 2 base metal, 3 brazing layer, 4 metallized layer, 10 single crystal diamond, 10a, main surface, 10b rake face, 10c flank face, 10d cutting edge, 11 defect portion, 20 single crystal substrate, 20a surface, 20b side surface, 21 groove, 22 conductive layer, 23 epitaxial growth layer, H height difference, L distance, M measurement region, P1 first peak, P2 second peak.

The invention claimed is:

1. A single crystal diamond into which a defect portion is introduced, said defect portion being detected by a phase difference occurring when said single crystal diamond is irradiated with circularly polarized light, said phase difference being detected over a plurality of measurement regions, each measurement region being formed in a shape of a square having a side length of 1 mm, said phase difference for each measurement region having a corresponding average value, and a maximum value of said average values of said plurality of measurement regions being 30 nm or more, wherein a standard deviation of said phase differences measured within said measurement region is 30 nm or more.

2. The single crystal diamond according to claim 1, wherein a plurality of peaks exist in a frequency distribution of said phase differences measured within said measurement region.

3. The single crystal diamond according to claim 2, wherein a first peak and a second peak exist in the frequency distribution of said phase differences measured within said measurement region, said first peak existing in a region of values of said phase differences that are smaller than the average value of said phase differences and said second peak existing in a region of values of said phase differences that are larger than the average value of said phase differences.

4. The single crystal diamond according to claim 1, wherein said defect portions are introduced so as to be arranged in a straight line.

5. The single crystal diamond according to claim 1, wherein said defect portions are introduced so as to be arranged in an arc line.

6. The single crystal diamond according to claim 1, formed by a vapor phase synthesis method.

7. The single crystal diamond according to claim 1, wherein said single crystal diamond is a diamond tool.

8. A diamond tool comprising the single crystal diamond according to claim 1.

9. A single crystal diamond into which a defect portion is introduced, said defect portion being detected by a phase difference occurring when said single crystal diamond is irradiated with circularly polarized light, said phase difference being detected over a plurality of measurement regions, each measurement region being formed in a shape of a square having a side length of 1 mm, said phase difference for each measurement region having a corresponding average value, and a maximum value of said average values of said plurality of measurement regions being 30 nm or more, wherein a first peak and a second peak exist in the frequency distribution of said phase differences measured within said measurement region, said first peak existing in a region of values of said phase differences that are smaller than the average value of said phase differences and said second peak existing in a region of values of said phase differences that are larger than the average value of said phase differences.

10. The single crystal diamond according to claim 9, wherein said defect portions are introduced so as to be arranged in a straight line.

11. The single crystal diamond according to claim 9, wherein said defect portions are introduced so as to be arranged in an arc line.

12. The single crystal diamond according to claim 9, formed by a vapor phase synthesis method.

13. The single crystal diamond according to claim 9, wherein said single crystal diamond is a diamond tool.

14. A diamond tool comprising the single crystal diamond according to claim 9.

* * * * *